United States Patent
Meng et al.

(10) Patent No.: US 11,024,010 B2
(45) Date of Patent: Jun. 1, 2021

(54) SUPER-RESOLUTION IMAGE SENSOR AND PRODUCING METHOD THEREOF

(71) Applicants: CAPITAL NORMAL UNIVERSITY, Beijing (CN); CHINAMAP HI-TECH (BEIJING) INFORMATION TECHNOLOGY CO., LTD., Beijing (CN)

(72) Inventors: Guanjia Meng, Beijing (CN); Huili Gong, Beijing (CN); Xiaojuan Li, Beijing (CN); Ruofei Zhong, Beijing (CN); Jiao Guo, Beijing (CN); Cankun Yang, Beijing (CN)

(73) Assignees: CAPITAL NORMAL UNIVERSITY, Beijing (CN); CHINAMAP HI-TECH (BEIJING), Beijing (CN)

( * ) Notice: Subject to any disclaimer, the term of this patent is extended or adjusted under 35 U.S.C. 154(b) by 47 days.

(21) Appl. No.: 15/771,852

(22) PCT Filed: Dec. 13, 2016

(86) PCT No.: PCT/CN2016/109662
§ 371 (c)(1),
(2) Date: Feb. 13, 2019

(87) PCT Pub. No.: WO2018/082156
PCT Pub. Date: May 11, 2018

(65) Prior Publication Data
US 2019/0311463 A1    Oct. 10, 2019

(30) Foreign Application Priority Data
Nov. 1, 2016 (CN) .......................... 201610937050.1

(51) Int. Cl.
*G06T 3/40* (2006.01)
*H01L 27/146* (2006.01)
(Continued)

(52) U.S. Cl.
CPC ...... *G06T 3/4053* (2013.01); *H01L 27/14625* (2013.01); *H04N 5/2254* (2013.01); *H04N 5/335* (2013.01); *H04N 5/369* (2013.01)

(58) Field of Classification Search
CPC ..... G06T 3/4053; G06T 3/4069; H04N 5/335; H04N 5/2254; H04N 5/369;
(Continued)

(56) References Cited

U.S. PATENT DOCUMENTS 10,027,908 B2 * 7/2018 Seifi ................... H04N 5/35563
2002/0181114 A1   12/2002 Bone et al.
(Continued)

FOREIGN PATENT DOCUMENTS

CN    101043046 A * 9/2007   ............. H04N 5/335
CN    101883215 A * 11/2010  ........... G02B 3/0056
(Continued)

OTHER PUBLICATIONS

Chinese Application Serial No. 201610937050.1, Notice of Allowance dated Jun. 6, 2019, 2 pgs.
(Continued)

*Primary Examiner* — Aaron W Carter
(74) *Attorney, Agent, or Firm* — Kwan & Olynick LLP

(57) ABSTRACT

Provided is a super-resolution image sensor and a producing method thereof such that, on the basis of not changing the arrangement of the image sensitive unit array of the image sensor, by means of the existing micro-lens manufacture techniques, the imaging resolution can be increased by offsetting micro-lens rows in a micro-lens array that covers upon the image sensitive unit array. In some examples, a super-resolution image sensor comprises an image sensitive unit array having image sensitive unit rows aligned with one another, and a micro-lens array covering upon the image sensitive unit array. Relative to a reference micro-lens row
(Continued)

in the micro-lens array, the other micro-lens rows are regularly offset. Each micro-lens unit in the reference micro-lens row is center aligned with a corresponding image sensitive unit in a reference image sensitive unit row.

16 Claims, 2 Drawing Sheets

(51) Int. Cl.
    *H04N 5/225*     (2006.01)
    *H04N 5/369*     (2011.01)
    *H04N 5/335*     (2011.01)
(58) Field of Classification Search
    CPC ......... H01L 27/14625; H01L 27/14627; H01L 27/14605
    See application file for complete search history.

(56) References Cited

U.S. PATENT DOCUMENTS

| | | | | |
|---|---|---|---|---|
| 2003/0042490 A1* | 3/2003 | Yamamoto | ........ | H01L 27/14685 257/72 |
| 2010/0283884 A1 | 11/2010 | Hayasaka et al. | | |
| 2011/0080508 A1 | 4/2011 | Katsuno et al. | | |
| 2011/0205388 A1* | 8/2011 | Iwane | ................ | H04N 5/23235 348/222.1 |
| 2011/0228142 A1* | 9/2011 | Brueckner | ........... | H04N 5/2254 348/241 |
| 2011/0273547 A1 | 11/2011 | Wang et al. | | |
| 2012/0050562 A1 | 3/2012 | Perwass et al. | | |
| 2012/0287331 A1* | 11/2012 | Iwane | ................ | G02B 27/0075 348/360 |
| 2013/0161774 A1 | 6/2013 | Okigawa | | |
| 2013/0321581 A1* | 12/2013 | El-Ghoroury | ........ | H04N 5/2257 348/46 |
| 2014/0125810 A1* | 5/2014 | D'Amico | ............... | H04N 9/045 348/164 |
| 2014/0168622 A1 | 6/2014 | Mizumura et al. | | |
| 2014/0267890 A1* | 9/2014 | Lelescu | ................ | H04N 5/2254 348/373 |
| 2014/0368690 A1* | 12/2014 | Fukuda | .................. | H04N 5/369 348/222.1 |
| 2015/0054104 A1 | 2/2015 | Black | | |
| 2015/0077600 A1* | 3/2015 | Kobayashi | ............. | G02B 5/201 348/273 |
| 2015/0092092 A1 | 4/2015 | Okigawa | | |
| 2015/0268392 A1 | 9/2015 | Kobayashi et al. | | |
| 2015/0271470 A1* | 9/2015 | Wu | ........................ | H04N 5/225 348/49 |
| 2017/0146789 A1* | 5/2017 | Lansel | ................ | G02B 21/367 |
| 2017/0366765 A1* | 12/2017 | Seifi | ...................... | H04N 5/2355 |
| 2018/0095275 A1* | 4/2018 | Nakajima | ........... | H04N 5/23287 |
| 2019/0004305 A1* | 1/2019 | Duckett, III | ......... | G02B 3/0037 |
| 2019/0052776 A1* | 2/2019 | Kawano | ................ | G02B 3/0006 |
| 2019/0214420 A1* | 7/2019 | Kim | ...................... | H01L 27/1463 |
| 2019/0311463 A1* | 10/2019 | Meng | ..................... | H04N 5/335 |
| 2020/0059618 A1* | 2/2020 | Watanabe | ......... | H01L 27/14645 |
| 2020/0112671 A1* | 4/2020 | Kang | ................... | H04N 5/2628 |

FOREIGN PATENT DOCUMENTS

| | | | | |
|---|---|---|---|---|
| CN | 102439979 A | * | 5/2012 | .......... H04N 5/2254 |
| CN | 102854753 A | | 1/2013 | |
| CN | 103081457 A | * | 5/2013 | ............. H04N 5/272 |
| CN | 103907061 A | * | 7/2014 | ............... G03F 9/70 |
| CN | 104350739 A | | 2/2015 | |
| CN | 104935793 A | | 9/2015 | |
| JP | H11317836 A | | 11/1999 | |
| JP | 2007101730 A | | 4/2007 | |
| KR | 20070047120 A | | 5/2007 | |
| TW | I222547 B | * | 10/2004 | |
| WO | 2007040165 A1 | | 4/2007 | |

OTHER PUBLICATIONS

Chinese Application Serial No. 201610937050.1, Office Action dated Jan. 2, 2019, 11 pgs.

* cited by examiner

SUPER-RESOLUTION IMAGE SENSOR AND PRODUCING METHOD THEREOF

CROSS-REFERENCE TO RELATED APPLICATIONS

This application is a national phase entry of PCT Application No. PCT/CN2016/109662, filed on Dec. 13, 2016, which claims priority to Chinese Patent Application No. 201610937050.1, filed on Nov. 1, 2016. Both of these applications are incorporated herein by reference in their entirety for all purposes.

TECHNICAL FIELD

The present invention relates to an image processing device, in particular relates to a super-resolution image sensor and a producing method thereof.

BACKGROUND

As the requirement for image resolution of civil and military remote sensing continues to increase and remote sensing satellites develop towards miniaturization, light-and-small high resolution optical remote sensors have become a research hotspot in the field of space remote sensing for spaceflight industry worldwide. In order to increase the image resolution of remote sensing, in the aspect of hardware implementation, sub-pixel imaging methods are commonly used at present, wherein, multiple low-resolution images of the same target with mutual displacement information are acquired, and the geometric resolution is increased by extracting redundant information from the displacement images. At present, a prevailing way of implementing the sub-pixel imaging technology is a new CCD design scheme proposed by French SPOT-5 and Hot Spot Recognition Sensors (HSRS) developed by German Aerospace Center, wherein, two pieces of mutually displaced long linear array CCD are integrated on one chip, i.e., focal plane integration, so that two low-resolution images are acquired on the same field of view by the two pieces of CCD, and in subsequent image processing, a high-resolution clear image can be obtained by fusing the two images with reconstructing algorithm.

At present, the sub-pixel imaging method is to arrange two CCD linear arrays to displace along the linear array direction, that is, the image sensitive units of the two CCD linear arrays themselves are mutually displaced, which changes the original arrangement of the image sensitive unit array of the image sensor.

High-sensitivity and high-resolution image sensing systems often requires the image sensor to have high response rate, high detection rate, low noise, a large number of image units, small image unit dimensions and a large filling factor. But these requirements are difficult to be met at the same time because of difficulties in material preparation and process manufacture. For example, the increase of spatial resolution can be realized by reducing the image unit dimensions and increasing the array size, but the reduction of image unit dimensions would cause weakening of the optic-electric signal and deterioration of the signal-to-noise characteristics. This is even more unfavorable to an image sensor array with a low filling factor. And the image unit dimensions cannot be blindly reduced. For an imaging device manufactured with a certain technique, its pixel dimension has a minimum value, and once this minimum value is reached, the resolution of the imaging device can no longer benefit from further reduction of the image unit dimensions. Therefore, it is very important to increase the resolution of the image sensing device through other methods.

Along with the development trend of miniaturization of optical elements, micro-lenses and micro-lens arrays having a millimeter level, micrometer level or even nanometer level diameter can already be manufactured. As the micro-lens technology matures, it may be considered to utilize variation of micro-lens arrangement to increase the resolution of the image sensor, so as to provide an easy and high-efficient way for solving these difficulties.

SUMMARY OF THE INVENTION

The technical problem to be solved by the present invention is how to provide a super-resolution image sensor and a producing method thereof such that, on the basis of not changing the arrangement of the image sensitive unit array of the image sensor, by means of the existing micro-lens manufacture techniques, the imaging resolution can be increased by offsetting micro-lens rows in a micro-lens array that covers upon the image sensitive unit array.

In order to solve the above-mentioned technical problem, the present invention adopts the following technical scheme:

In one aspect, the present invention provides a super-resolution image sensor which comprises an image sensitive unit array having image sensitive unit rows aligned with one another, and a micro-lens array covering upon the image sensitive unit array, wherein, relative to a reference micro-lens row in the micro-lens array, the other micro-lens rows are regularly offset, and each micro-lens unit in the reference micro-lens row is center aligned with a corresponding image sensitive unit in a reference image sensitive unit row.

For the aforementioned super-resolution image sensor, every two neighboring micro-lens rows in the micro-lens array have an offset of 1/n length of one image unit, where n is an integer larger than 1, each image sensitive unit in a first image sensitive unit row as the reference image sensitive unit row is center aligned with a corresponding micro-lens unit in a first micro-lens row as the reference micro-lens row, micro-lens units in a second micro-lens row next to the first micro-lens row are center offset by 1/n length of one image unit relative to image sensitive units in a second image sensitive unit row next to the first image sensitive unit row, and so forth, micro-lens units in a $n^{th}$ micro-lens row next to the $(n-1)^{th}$ micro-lens row are center offset by $(n-1)/n$ length of one image unit relative to image sensitive units in a $n^{th}$ image sensitive unit row next to the $(n-1)^{th}$ image sensitive unit row.

For the aforementioned super-resolution image sensor, the offset is along a row direction.

For the aforementioned super-resolution image sensor, the image sensor is a CCD image sensor or a CMOS image sensor.

For the aforementioned super-resolution image sensor, the micro-lens array is a refractive micro-lens array.

In another aspect, the present invention provides a producing method of a super-resolution image sensor which comprises the following steps:

producing an image sensitive unit array having image sensitive unit rows aligned with one another;

producing a micro-lens array, in which, relative to a reference micro-lens row, the other micro-lens rows are regularly offset;

covering the micro-lens array onto the image sensitive unit array and integrating the two arrays in such a way that each image sensitive unit in a reference image sensitive unit row is center aligned with a corresponding micro-lens unit in the reference micro-lens row.

For the aforementioned producing method of the super-resolution image sensor, the step of producing a micro-lens array, in which, relative to a reference micro-lens row, the other micro-lens rows are regularly offset further comprises that every two neighboring micro-lens rows in the micro-lens array have an offset of 1/n length of one image unit, where n is an integer larger than 1; the step of covering the micro-lens array onto the image sensitive unit array and integrating the two arrays further comprises that each image sensitive unit in a first image sensitive unit row as the reference image sensitive unit row is center aligned with a corresponding micro-lens unit in a first micro-lens row as the reference micro-lens row, micro-lens units in a second micro-lens row next to the first micro-lens row are center offset by 1/n length of one image unit relative to image sensitive units in a second image sensitive unit row next to the first image sensitive unit row, and so forth, micro-lens units in a $n^{th}$ micro-lens row next to the $(n-1)^{th}$ micro-lens row are center offset by (n−1)/n length of one image unit relative to image sensitive units in a $n^{th}$ image sensitive unit row next to the $(n-1)^{th}$ image sensitive unit row.

For the aforementioned producing method of the super-resolution image sensor, the offset is along a row direction.

For the aforementioned producing method of the super-resolution image sensor, the image sensor is a CCD image sensor or a CMOS image sensor.

For the aforementioned producing method of the super-resolution image sensor, the micro-lens array is a refractive micro-lens array.

As compared to the prior art, the technical scheme of the present invention has the following advantages:

By means of the present invention, under the condition that the existing image sensitive unit structure is unchanged, the imaging resolution can be increased by changing the optical device structure on the hardware surface to get a displacement imaging effect. This image sensor and its producing method can utilized to increase the resolution, and are easier to implement in engineering.

Other features and advantages of the present invention are described in the following description, and would partially become apparent from the description or would become understood by implementing the present invention. The purposes and other advantages of the present invention can be implemented and obtained by the structures specifically pointed out in the written Specification, Claims and Drawings.

BRIEF DESCRIPTION OF THE DRAWINGS

Other advantages and benefits would become clear to a person skilled in the art by reading the detailed description of preferred embodiments hereinafter. The appended drawings are only intended for the purpose of illustrating the preferred embodiments, and should not be considered as limitations to the present invention. And in all the drawings, the same reference signs are used to represent the same components. In the drawings.

DETAILED DESCRIPTION OF EMBODIMENTS

Hereinafter, illustrative embodiments of the present disclosure are described in more detail with reference to the appended drawings. Although the illustrative embodiments of the present disclosure are shown in the appended drawings, it should be understood that, the present disclosure may be implemented in various forms, not limited by the embodiments illustrated herein. On the contrary, providing these embodiments is for being able to make the present disclosure more thoroughly understood and for being able to completely convey the scope of the present disclosure to a person skilled in the art.

Figure 1:
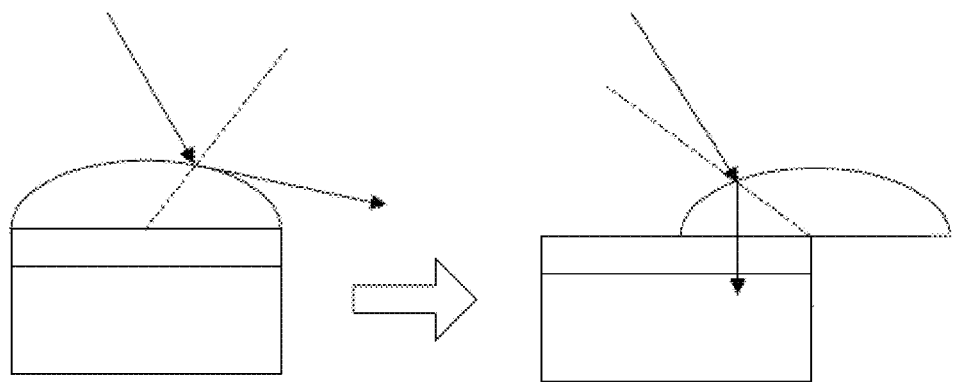
FIG. 1 is an imaging principle schematic diagram of a super-resolution image sensor according to an embodiment of the present invention.

As shown in FIG. 1, according to the refraction and reflection principles of a lens, the light reflected when a lens is aligned with an image sensitive unit would become refracted when the image sensitive unit is offset, so as to realize the shifting of light for the purpose of displacement imaging.

Figure 2A:
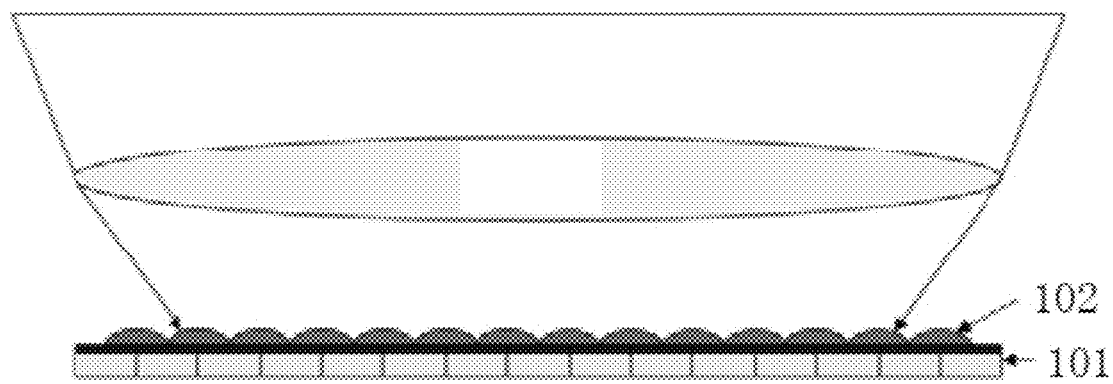
FIG. 2a and FIG. 2b show the positional relation in a stacking direction between micro-lens units and image sensitive units of a super-resolution image sensor according to an embodiment of the present invention.
Figure 2B:
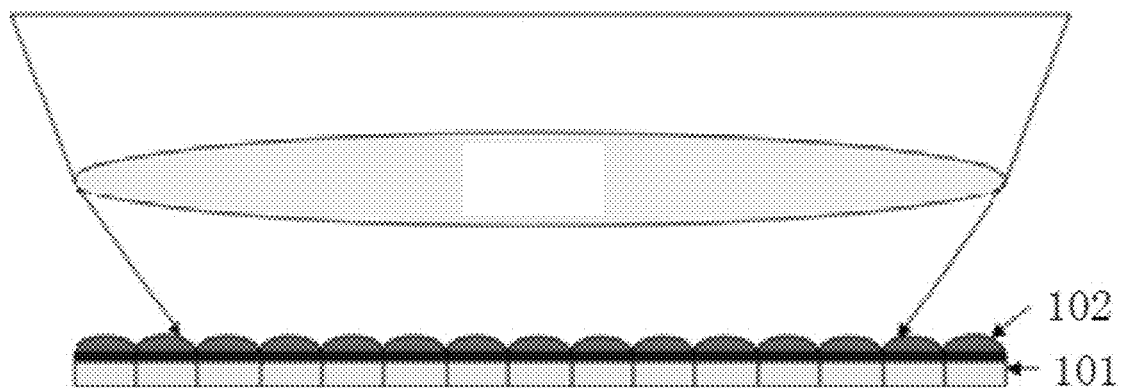

The positional relation in a stacking direction between micro-lens units and image sensitive units is shown in FIG. 2a and FIG. 2b, wherein the incident light goes through a camera wide-angle lens to arrive at the micro-lens array 102 on the image sensitive unit array 101. A super-resolution image sensor according to an embodiment of the present invention comprises an image sensitive unit array 101 having image sensitive unit rows aligned with each another, and a micro-lens array 102 covering upon the image sensitive unit array 101, as shown in FIG. 2a. Relative to a reference micro-lens row in the micro-lens array 102, the other micro-lens rows are regularly offset, and each micro-lens unit in the reference micro-lens row is center aligned with a corresponding image sensitive unit in a reference image sensitive unit row in a stacking direction, so that when it is viewed from the stacking direction, the center of the first micro-lens unit in the reference micro-lens row is on the same straight line as the center of the first image sensitive unit in a reference image sensitive unit row, the center of the second micro-lens unit in the reference micro-lens row is on the same straight line as the center of the second image sensitive unit in a reference image sensitive unit row, and so forth. The micro-lens array 102 is preferably a refractive micro-lens array.

Figure 3:
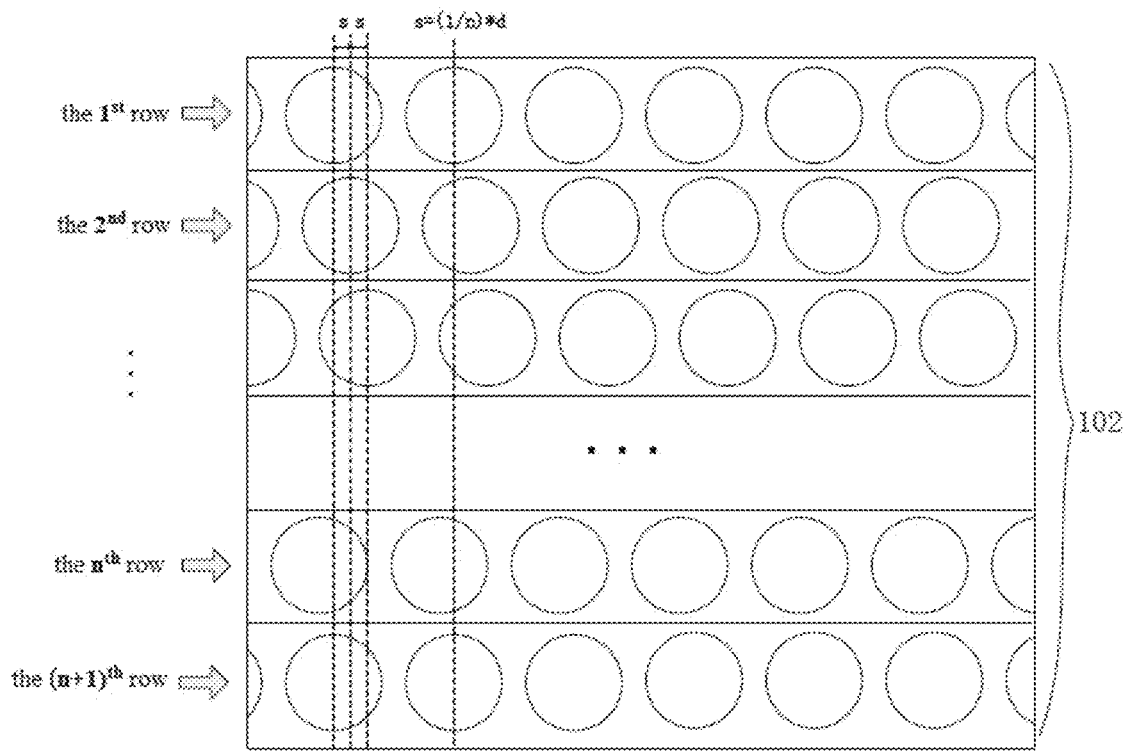
FIG. 3 is a top view of a micro-lens array of a super-resolution image sensor according to an embodiment of the present invention.

FIG. 3 is a top view of a micro-lens array according to an embodiment of the present invention. In a preferred embodiment of the present invention, the image sensitive unit rows of the image sensitive unit array are aligned with one another; every two neighboring micro-lens rows in the micro-lens array have an offset of 1/n length of one image unit, where n is an integer larger than 1; the number of image sensitive unit rows of the image sensitive unit array 101 is equal to the number of micro-lens rows of the micro-lens array 102, the numbers of units in corresponding rows are equal, the intervals between corresponding units in corresponding rows are also equal, and the row pitch between neighboring image sensitive unit rows of the image sensitive unit array 101 is equal to the row pitch between neighboring micro-lens rows of the micro-lens array 102. The first image sensitive unit row of the image sensitive unit array 101 is taken as a reference image sensitive unit row, the first micro-lens row of the micro-lens array 102 is taken as the reference micro-lens row, and accordingly, each image sensitive unit in the first image sensitive unit row is center aligned with a corresponding micro-lens unit in the first micro-lens row, micro-lens units in a second micro-lens row next to the first micro-lens row are center offset by 1/n length of one image unit along a row direction relative to image sensitive units in a second image sensitive unit row next to the first image sensitive unit row, and so forth, micro-lens units in a $n^{th}$ micro-lens row next to the $(n-1)^{th}$ micro-lens row are center offset by (n-1)/n length of one image unit along a row direction relative to image sensitive units in a $n^{th}$ image sensitive unit row next to the $(n-1)^{th}$ image sensitive unit row. So n rows of image sensitive units form a cycle, each micro-lens unit in a $(n+1)^{th}$ micro-lens row is center aligned with a corresponding micro-lens unit in the first micro-lens row, and as a result, the micro-lens units in the $(n+1)^{th}$ micro-lens row respectively form columns with the micro-lens units in the first micro-lens row on the plane of the micro-lens array.

When the above-mentioned super-resolution image sensor works in a push-broom imaging mode, multiple pixel-displacement images are generated on the same field of view, and in subsequent image processing, these displacement images are fusion processed by a reconstructing algorithm so as to obtain a high-resolution clear image.

If it is assumed that the length of one image unit is d and the step length for push-broom imaging by the image sensor is d, the offset distance between neighboring rows of the micro-lens array 102 is (1/n)*d, and if the sampling interval in the push-broom direction is reduced to d/n, then, by applying a reconstructing algorithm to the images acquired in a cycle (n times of sampling), the resulting imaging resolution can be made n times of the imaging resolution acquired by an image sensor with its micro-lens centers all aligned with its image sensitive unit centers.

Hereinafter, the technical scheme of the present invention is further illustrated by an example of a CMOS image sensor having nine image sensitive unit rows in a cycle.

The super-resolution CMOS image sensor according to the present invention comprises a basic area array CMOS device and a refractive micro-lens array covering upon the area array CMOS device, as shown in FIG. 2a and FIG. 2b.

Every lens in the micro-lens array has the same specification. Upon an image sensitive unit row that does not need to be offset, the lenses are center aligned with the image sensitive units, that is to say, the image sensitive units in a reference row are center aligned with corresponding lenses; in a second image sensitive unit row that needs to be offset which is next to the first image sensitive unit row that does not need to be offset, the lenses are center offset by ⅑ length of one image sensitive unit along a row direction relative to the corresponding image sensitive units; in a third image sensitive unit row that needs to be offset which is next to the second image sensitive unit row that needs to be offset, the lenses are center offset by ⅔ length of one image sensitive unit along a row direction relative to the corresponding image sensitive units; and so forth, in a ninth image sensitive unit row that needs to be offset which is next to the eighth image sensitive unit row that needs to be offset, the lenses are center offset by ⅚ length of one image sensitive unit along a row direction relative to the corresponding image sensitive units. If it is assumed that the length of one CMOS image sensitive unit is d in this embodiment and the first micro-lens row is a reference row with no offset for micro-lenses, the second micro-lens row has a (⅑)*d offset relative to the first micro-lens row, the third micro-lens row has a (⅑)*d offset relative to the second micro-lens row and has a (⅔)*d offset relative to the first micro-lens row, . . . , and so forth. So 9 rows form a cycle, and the $10^{th}$ row is re-aligned with the $1^{st}$ row.

Hereinafter, the technical scheme of the present invention is further illustrated by an example of a CCD image sensor having two image sensitive unit rows in a cycle.

The super-resolution CCD image sensor in this invention comprises an area array CCD device having two image sensitive unit rows in a cycle, and a refractive micro-lens array covering upon the area array CCD device, as shown in FIG. 2a and FIG. 2b.

Every lens in the micro-lens array has the same specification. Upon an image sensitive unit row that does not need to be offset, the lenses are center aligned with the image sensitive units; upon an image sensitive unit row that needs to be offset, the lenses are center offset by ½ length of one image sensitive unit relative to the corresponding image sensitive units. If it is assumed that the length of one CCD image sensitive unit is d in this embodiment and the first micro-lens row is a reference row with no offset for micro-lenses, the second micro-lens row has a (½)*d offset relative to the first micro-lens row. So 2 rows form a cycle, and the $3^{rd}$ row is re-aligned with the $1^{st}$ row.

Figure 4:
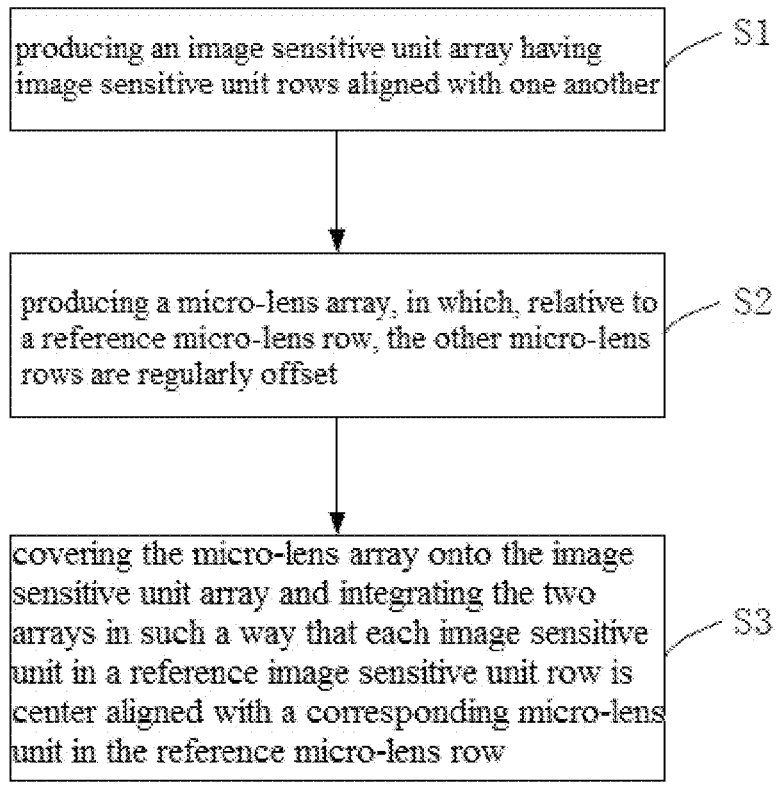
FIG. 4 is a flow chart of a producing method of a super-resolution image sensor according to an embodiment of the present invention.

As shown in FIG. 4, a producing method of a super-resolution image sensor in this invention comprises the following steps:

Step S1, producing an image sensitive unit array 101 having image sensitive unit rows aligned with one another;

Step S2, producing a micro-lens array 102, in which, relative to a reference micro-lens row, the other micro-lens rows are regularly offset;

Step S3, covering the micro-lens array 102, preferably a refractive micro-lens array, onto the image sensitive unit array 101 and integrating the two arrays in such a way that each image sensitive unit in a reference image sensitive unit row is center aligned with a corresponding micro-lens unit in the reference micro-lens row.

The Step S2 further comprises that, every two neighboring micro-lens rows in the micro-lens array 102 have an offset of 1/n length of one image unit, where n is an integer larger than 1.

The Step S3 further comprises that, each image sensitive unit in a first image sensitive unit row as the reference image sensitive unit row is center aligned with a corresponding micro-lens unit in a first micro-lens row as the reference micro-lens row, micro-lens units in a second micro-lens row next to the first micro-lens row are center offset by 1/n length of one image unit along a row direction relative to image sensitive units in a second image sensitive unit row next to the first image sensitive unit row, and so forth, micro-lens units in a $n^{th}$ micro-lens row next to the $(n-1)^{th}$ micro-lens row are center offset by (n-1)/n length of one image unit along a row direction relative to image sensitive units in a $n^{th}$ image sensitive unit row next to the $(n-1)^{th}$ image sensitive unit row.

Apparently, a person skilled in the art may make various changes and modifications to the present invention without departing from the spirit and scope of the present invention. Thus, if such changes and modifications made to the present invention belong to the scope of the Claims of the present invention and its equivalent technology, these changes and modifications are intended to be included within the present invention.

What is claimed is:

1. A super-resolution image sensor, comprising
an image sensitive unit array having image sensitive unit rows aligned with one another; and
a micro-lens array covering upon the image sensitive unit array, wherein:
the image sensitive unit rows in the image sensitive unit array are not offset relative to one another,
relative to a reference micro-lens row in the micro-lens array, the other micro-lens rows are regularly offset, and
each micro-lens unit in the reference micro-lens row is center aligned with a corresponding image sensitive unit in a reference image sensitive unit row in a stacking direction, while each micro-lens unit in each of the other non-reference micro-lens rows has a center that is offset relative to a center of a corresponding image sensitive unit in a corresponding non-reference image sensitive unit row in the stacking direction.

2. The super-resolution image sensor of claim 1, wherein, every two neighboring micro-lens rows in the micro-lens array have an offset of 1/n length of one image unit, where n is an integer larger than 1, each image sensitive unit in a first image sensitive unit row as the reference image sensitive unit row is center aligned with a corresponding micro-lens unit in a first micro-lens row as the reference micro-lens row, micro-lens units in a second micro-lens row next to the first micro-lens row are center offset by 1/n length of one image unit relative to image sensitive units in a second image sensitive unit row next to the first image sensitive unit row, and so forth, micro-lens units in a $n^{th}$ micro-lens row next to the $(n-1)^{th}$ micro-lens row are center offset by $(n-1)/n$ length of one image unit relative to image sensitive units in a $n^{th}$ image sensitive unit row next to the $(n-1)^{th}$ image sensitive unit row.

3. The super-resolution image sensor of claim 1, wherein, the offset is along a row direction.

4. The super-resolution image sensor of claim 1, wherein, the image sensor is a CCD image sensor or a CMOS image sensor.

5. The super-resolution image sensor of claim 1, wherein, the micro-lens array is a refractive micro-lens array.

6. A method of producing a super-resolution image sensor, the method comprising the steps of:
producing an image sensitive unit array having image sensitive unit rows aligned with one another, wherein the image sensitive unit rows in the image sensitive unit array are not offset relative to one another;
producing a micro-lens array, in which, relative to a reference micro-lens row, the other micro-lens rows are regularly offset; and
covering the micro-lens array onto the image sensitive unit array and integrating the two arrays in such a way that each image sensitive unit in a reference image sensitive unit row is center aligned with a corresponding micro-lens unit in the reference micro-lens row, and that each micro-lens unit in each of the other non-reference micro-lens rows has a center that is offset relative to a center of a corresponding image sensitive unit in a corresponding non-reference image sensitive unit row.

7. The method of claim 6, wherein,
the step of producing a micro-lens array, in which, relative to a reference micro-lens row, the other micro-lens rows are regularly offset further comprises every two neighboring micro-lens rows in the micro-lens array have an offset of 1/n length of one image unit, where n is an integer larger than 1; and
the step of covering the micro-lens array onto the image sensitive unit array and integrating the two arrays further comprises each image sensitive unit in a first image sensitive unit row as the reference image sensitive unit row is center aligned with a corresponding micro-lens unit in a first micro-lens row as the reference micro-lens row, micro-lens units in a second micro-lens row next to the first micro-lens row are center offset by 1/n length of one image unit relative to image sensitive units in a second image sensitive unit row next to the first image sensitive unit row, and so forth, micro-lens units in a $n^{th}$ micro-lens row next to the $(n-1)^{th}$ micro-lens row are center offset by $(n-1)/n$ length of one image unit relative to image sensitive units in a $n^{th}$ image sensitive unit row next to the $(n-1)^{th}$ image sensitive unit row.

8. The method of claim 6, wherein, the offset is along a row direction.

9. The method of claim 6, wherein, the image sensor is a CCD image sensor or a CMOS image sensor.

10. The method of claim 6, wherein, the micro-lens array is a refractive micro-lens array.

11. The super-resolution image sensor of claim 2, wherein, the offset is along a row direction.

12. The super-resolution image sensor of claim 2, wherein, the image sensor is a CCD image sensor or a CMOS image sensor.

13. The super-resolution image sensor of claim 2, wherein, the micro-lens array is a refractive micro-lens array.

14. The method of claim 7, wherein, the offset is along a row direction.

15. The producing method of claim 7, wherein, the image sensor is a CCD image sensor or a CMOS image sensor.

16. The producing method of claim 7, wherein, the micro-lens array is a refractive micro-lens array.

* * * * *